United States Patent
Sakaguchi et al.

(10) Patent No.: US 7,507,655 B2
(45) Date of Patent: Mar. 24, 2009

(54) METHOD OF FORMING SOLDER CONNECTION PORTIONS, METHOD OF FORMING WIRING SUBSTRATE AND METHOD OF PRODUCING SEMICONDUCTOR DEVICE

(75) Inventors: Hideaki Sakaguchi, Nagano (JP); Mitsutoshi Higashi, Nagano (JP)

(73) Assignee: Shinko Electric Industries, Co., Ltd., Nagano-shi (JP)

( * ) Notice: Subject to any disclaimer, the term of this patent is extended or adjusted under 35 U.S.C. 154(b) by 68 days.

(21) Appl. No.: 11/696,473

(22) Filed: Apr. 4, 2007

(65) Prior Publication Data

US 2007/0234563 A1 Oct. 11, 2007

(30) Foreign Application Priority Data

Apr. 11, 2006 (JP) .............................. 2006-108878

(51) Int. Cl.
*H01L 23/488* (2006.01)
(52) U.S. Cl. ................. 438/613; 257/E21.508
(58) Field of Classification Search ................. 438/613, 438/FOR. 377; 257/E21.509
See application file for complete search history.

(56) References Cited

U.S. PATENT DOCUMENTS

| | | | | | |
|---|---|---|---|---|---|
| 5,749,614 | A | * | 5/1998 | Reid et al. | .................. 294/64.1 |
| 6,911,388 | B2 | * | 6/2005 | Kee et al. | .................... 438/613 |
| 2003/0164395 | A1 | * | 9/2003 | Tong et al. | ................ 228/123.1 |
| 2004/0041393 | A1 | * | 3/2004 | Lee | ............................. 283/100 |
| 2008/0003805 | A1 | * | 1/2008 | Pang et al. | .................. 438/613 |
| 2008/0054455 | A1 | * | 3/2008 | Tsao et al. | ................... 257/737 |

FOREIGN PATENT DOCUMENTS

| | | |
|---|---|---|
| JP | 4-269834 | 9/1992 |
| JP | 2004-327536 | 11/2004 |

* cited by examiner

*Primary Examiner*—George Fourson
(74) *Attorney, Agent, or Firm*—Rankin, Hill & Clark LLP (57) ABSTRACT

A method of forming solder connection portions on first electrode pads and on second electrode pads, comprises a first step of arranging solder balls on the first electrode pads by arranging a first mask on a base mask; a second step of arranging solder balls on the second electrode pads by arranging a second mask on the base mask; and a third step of melting the solder balls. The base mask has first opening portions corresponding to the first electrode pads and second opening portions corresponding to the second electrode pads and having a size different from that of the first opening portions. The first mask has opening portions corresponding to the first opening portions and covering the second opening portions. The second mask has opening portions corresponding to the second opening portions and covers the first opening portions.

5 Claims, 6 Drawing Sheets

METHOD OF FORMING SOLDER CONNECTION PORTIONS, METHOD OF FORMING WIRING SUBSTRATE AND METHOD OF PRODUCING SEMICONDUCTOR DEVICE

This application claims priority to Japanese Patent Application No. 2006-108878, filed Apr. 11, 2006, in the Japanese Patent Office. The priority application is incorporated by reference in its entirety.

TECHNICAL FIELD

The present disclosure relates to a method of forming solder connection portions, a method of forming a wiring substrate by using the method of forming the solder connection portions and a method of producing a semiconductor device by using the method of forming the solder connection portions.

RELATED ART

Efforts have been made to highly densely integrate connection portions (electrode pads) of semiconductor chips accompanying the modern trend toward highly densely mounting the semiconductor chips. Therefore, the semiconductor chips have been mounted by using solder connection portions which are so-called solder bumps (salient electrodes) in order to highly densely arrange the connection portions of the semiconductor chips.

According to the above method, the semiconductor chips and the mounting substrate are electrically connected together by using, for example, an array of solder bumps on the side of the semiconductor chips or on the side of the mounting substrate (see, for example, Japanese Patent Unexamined Publication No. 2004-327536 (patent document 1)).

Usually, a plurality of solder bumps arranged in array all have the same size (diameter). Depending upon the specifications of the semiconductor chips (mounting substrate), however, the solder bumps may often have different sizes (diameters) on the plane of the semiconductor chip (mounting substrate).

When the solder bumps have different diameters as described above, however, it becomes difficult to form the solder bumps relying, for example, upon the printing method if the pitches become narrow. Therefore, a method has been proposed to arrange the solder balls of different diameters on the electrode pads by using a mask having a plurality of opening portions of different diameters (see Japanese Patent Unexamined Publication No. 4-269834 (patent document 2)). In the method of the patent document 2, firstly, solder balls with a large diameter are supplied on a circuit substrate and placed in the opening portions with a large diameter of the mask, and after the solder balls which were not placed in the opening portions are collected, the placed solder balls with a large diameter are melted to form the solder bumps on the electrode pads with a large diameter. Similarly, solder balls with a small diameter are supplied on the circuit substrate and placed in the opening portion with a small diameter of the mask, and after the solder balls which were not placed in the opening portions are collected, the placed solder ball with a small diameter are melted to form the solder bumps on the electrode pads with a small diameter.

According to the method of the patent document 2, however, solder balls of different diameters are made present in the step of placing the solder balls on the opening portions, and the solder balls with larger and small diameters which were not placed in the opening portion of the mask are collected in one place. When the collected solder balls other than the placed solder balls are to be used again, therefore, it becomes difficult to sort them out relying on a difference in the diameters. This causes an increase in the cost of producing the semiconductor devices and the mounting substrates.

According to the method taught in the patent document 2, further, when the solder balls to be placed have a small difference in the diameters (sizes), it is probable that solder balls may be placed on different (wrong) opening portions (electrode pads) arousing a problem from the standpoint of mounting precision.

SUMMARY

Embodiments of the present invention provide a method of forming solder connection portions, a method of forming a wiring substrate by using the method of forming the solder connection portions and a method of producing a semiconductor device by using the method of forming the solder connection portions.

Concretely, embodiments of the present invention provide the method of forming solder connection portions of different diameters on the electrode pads favorably and reliably, the method of forming a wiring substrate by using the method of forming the solder connection portions and the method of producing a semiconductor device by using the method of forming the solder connection portions.

According to a first aspect of the invention, there is provided a method of forming solder connection portions on first electrode pads and on second electrode pads, comprising a first step of arranging solder balls on the first electrode pads by arranging a first mask on a base mask, the base mask having first opening portions corresponding to the first electrode pads and second opening portions corresponding to the second electrode pads and having a size different from that of the first opening portions, the first mask having opening portions corresponding to the first opening portions and covering the second opening portions; a second step of arranging solder balls on the second electrode pads by arranging a second mask on the base mask, the second mask having opening portions corresponding to the second opening portions and covering the first opening portions; and a third step of melting the solder balls.

According to the first aspect of the present invention, the solder connection portions of different diameters can be formed on the electrode pads favorably and desirably.

According to a second aspect of the invention, there is provided a method of producing a wiring substrate by using the method of forming solder connection portions.

According to the second aspect of the present invention, a wiring substrate forming solder connection portions of different diameters on the electrode pads can be produced favorably and reliably.

According to a third aspect of the invention, there is provided a method of producing a semiconductor device by using the method of forming solder connection portions.

According to the third aspect of the present invention, a semiconductor device forming solder connection portions of different diameters on the electrode pads can be produced favorably and reliably.

One or more embodiments of the present invention may include one or more the following advantages. For example, it is possible to provide the method of forming solder connection portions of different diameters on the electrode pads favorably and reliably, the method of forming a wiring substrate by using the method of forming solder connection portions and the method of producing a semiconductor device by using the method of forming solder connection portions.

If it is attempted to simultaneously mount the solder balls of different sizes on a mask as in a related art (e.g., patent document 2), a problem arouses in that solder balls of different diameters are also made present. When the solder balls other than those solder balls that are placed are to be used again, therefore, it becomes difficult to sort out the solder balls depending upon the diameters. Or, if the solder balls to be placed have a small difference in the diameter (size), the solder balls are often placed on different opening portions (electrode pads).

According to the method of forming solder connection portions of the present invention, therefore, the first mask and the second mask are successively arranged on the base mask, the first mask having opening portions corresponding to the first electrode pads and covering the second electrode pads and second mask having opening portions corresponding to the second electrode pads and covering the first electrode pads. This improves reliability of when the solder balls of different sizes (diameters) are to be placed (mounted).

Further, the first mask and the second mask are arranged on the base mask that has the first opening portions corresponding to the first electrode pads and the second opening portions corresponding to the second electrode pads and having a size different from that of the first opening portions, so as to exhibit the following effect.

In this case, the solder balls placed on the first electrode pads or on the second electrode pads are held by the base mask, and are suppressed from deviating, enabling the solder connection portions to exhibit the effect of improved reliability.

For example, if the first mask is to be replaced by the second mask after the solder balls have been placed by using the first mask, the solder balls that have been placed already on the first electrode pad can be suppressed from being deviated by the base mask. Other features and advantages may be apparent from the following detailed description, the accompanying drawings and the claims.

DETAILED DESCRIPTION

Described below with reference to the drawings are the method of forming the solder connection portions, the wiring substrate using the above forming method, and the production of the semiconductor device.

First Example

Figure 1:
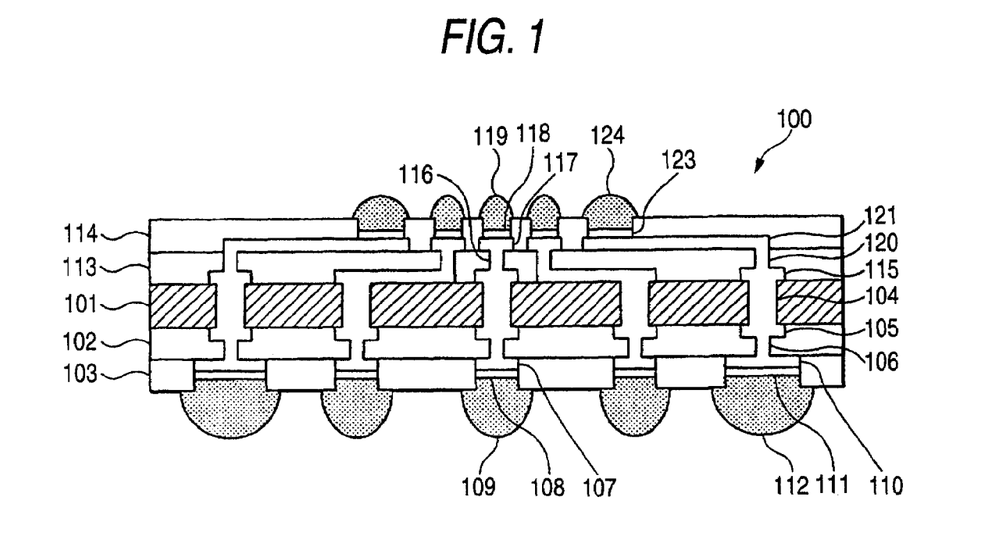
FIG. 1 is a view illustrating a wiring substrate according to a first embodiment.

FIG. 1 is a sectional view schematically illustrating the structure of a wiring substrate produced by the method (described later) of forming solder connection portions according to a first embodiment of the invention.

Referring to FIG. 1, a wiring substrate (mounting substrate) 100 has a core substrate 101 made of, for example, a prepreg member, and a plurality of via-plugs 104 so as to penetrate through the core substrate 101.

Pattern wirings 105 connected to the via-plugs 104 are formed on a first surface of the core substrate 101, and pattern wirings 115 connected to via-plugs 104 are similarly formed on a second surface of the core substrate on the side opposite to the first surface.

Further, an insulating layer 102 is formed so as to cover the pattern wirings 105, and via-plugs 106 are formed in the insulating layer 102 so as to be connected to the pattern wirings 105. Moreover, electrode pads 107, 110 connected to the via-plugs 106 are formed on the insulating layer 102 on the side opposite to the side that is in contact with the core substrate 101.

A solder resist layer (insulating layer) 103 is formed surrounding the electrode pads 107, 110 so as to cover the insulating layer 102, and metal layers 108, 111 are formed on the electrode pads 107, 110 exposed through the solder resist layer 103 so as to improve adhesion to, for example, solder connection portions.

Solder connection portions (solder bumps) 109, 112 are formed on the metal layers 108, 111. In the above structure, the electrode pads 107 are smaller than the electrode pads 110. When viewed on a plane, the solder connection portions 109 have a diameter smaller than a diameter of the solder connection portions 112.

An insulating layer 113 is formed on the second surface of the core substrate 101 so as to cover the pattern wirings 115, and a solder resist layer (insulating layer) 114 is laminated on the insulating layer 113.

Further, via-plugs 116 are formed in the insulating layer 113 so as to be connected to the pattern wirings 115. Further, electrode pads 117 connected to the via-plugs 116 are formed on the insulating layer 113, metal layers 118 are formed on the electrode pads 117 so as to improve adhesion to the solder connection portions, and solder connection portions (solder bumps) 119 are formed on the metal layers 118.

Similarly, electrode pads 121 connected to the via-plugs 120 are formed on the insulating layer 113, metal layers 123 are formed on the electrode pads 121 to improve adhesion to the solder connection portions, and solder connection portions (solder bumps) 124 are formed on the metal layers 123.

In the wiring substrate 100 of this embodiment, a semiconductor chip is flip-chip-mounted on the side of, for example, the solder connection portions 119, 124. The wiring substrate 100 has a structure of being mounted, for example, on a mother board or the like by using the solder connection portions 109, 112.

In the above wiring substrate 100, the core substrate 101 is made of, for example, a prepreg material, and the insulating layers 102 and 113 are made of a so-called buildup resin such as an epoxy material or a polyimide material. Further, the via-plugs 104, 106, 116 and 120 as well as pattern wirings 105, 115 and electrode pads 107, 110, 117 and 121 are formed by using Cu. The metal layers 108, 111, 118 and 123 are constituted by, for example, an Au/Ni layer or an Au/Pd/Ni layer (laminated layer structure with Au on the outer side).

Described below next is the method of producing the wiring substrate 100. The above core substrate 101, insulating layers 102, 113, solder resist layers 103, 114, via-plugs 104, 106, 116, 120, pattern wirings 105, 115, electrode pads 107, 110, 117, 121, and metal layers 108, 111, 118, 123 can be formed relying upon a known buildup method.

Figure 2A:
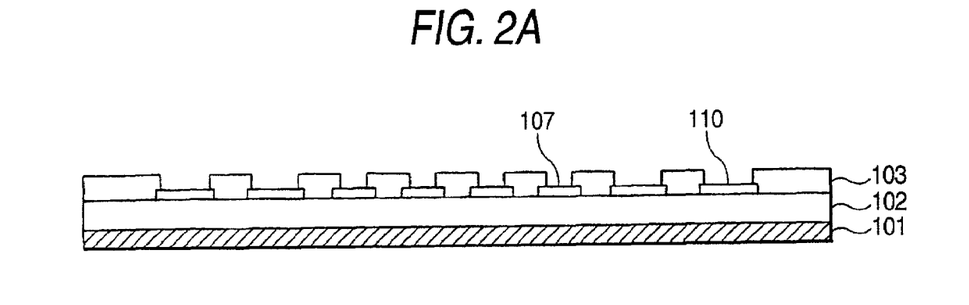
FIG. 2A is a view (No. 1) illustrating a method of producing the wiring substrate according to the first embodiment.

A method of forming solder connection portions 109, 112 on the electrode pads 107, 110 will now be successively described with reference to FIGS. 2A to 2J. However, the portions described above are denoted by the same reference numerals, and their description may not often be repeated. FIG. 2A illustrates the constitutions of only the core substrate 101, insulating layer 102, solder resist layer 103 and electrode pads 107, 110. That is, the via-plugs 104, 106, pattern wirings 105, and metal layers 108, 111 are not shown. Further, the numbers of electrode pads 107, 110 are different from those of FIG. 1. The numbers of electrode pads 107, 110, however, can be arbitrarily varied, and FIG. 2A and the subsequent drawings illustrate some of the examples.

At a step shown in FIG. 2A, the insulating layer (buildup layer 102) is formed on the core substrate 101 by a known buildup method. Though not shown, there are further formed via-plugs 104, 106, pattern wirings 105 and electrode pads 107, 110. The solder resist layer 103 is further formed to surround the electrode pads 107, 110. In the above structure, the electrode pads 107 are formed to be smaller than the electrode pads 110 (the electrode pads 110 are larger than the electrode pads 107).

Figure 2B:
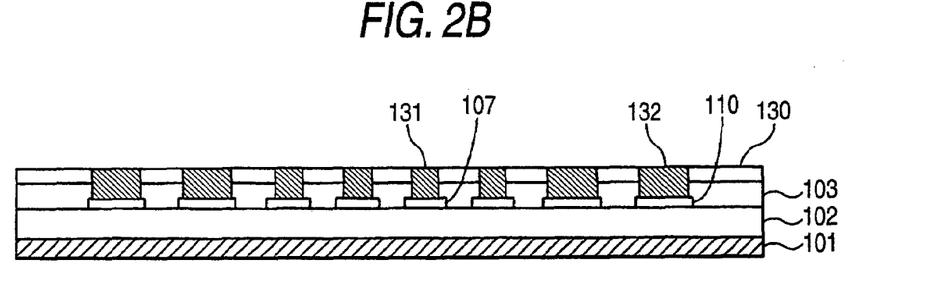
FIG. 2B is a view (No. 2) illustrating the method of producing the wiring substrate according to the first embodiment.

Next, at a step shown in FIG. 2B, the mask 130 having opening portions for exposing the electrode pads 107, 110 is arranged on the solder resist layer 103. On the electrode pads 107, 110 that are exposed are formed flux layers 131, 132 for fixing solder balls that will be placed at a subsequent step.

Figure 2C:
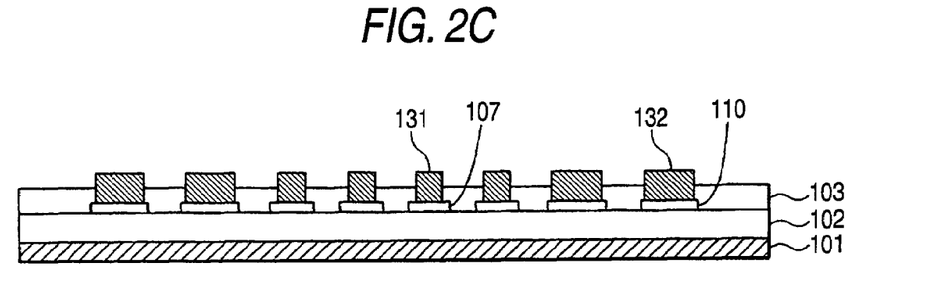
FIG. 2C is a view (No. 3) illustrating the method of producing the wiring substrate according to the first embodiment.

Next, the mask 130 is removed at a step shown in FIG. 2C.

Figure 2D:
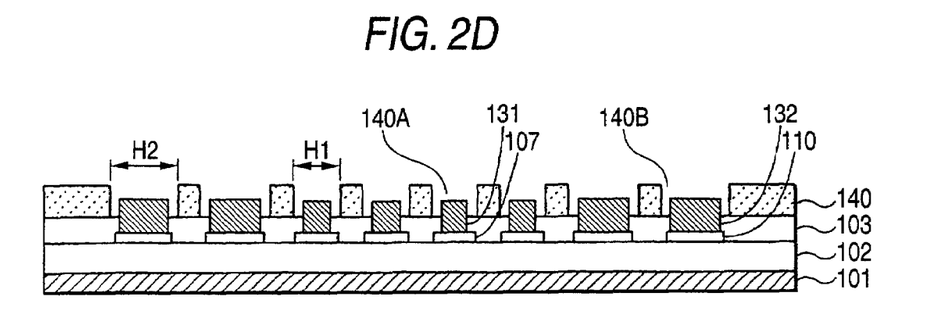
FIG. 2D is a view (No. 4) illustrating the method of producing the wiring substrate according to the first embodiment.

At a step shown in FIG. 2D, a base mask 140 is arranged on the solder resist layer 103, the base mask 140 having opening potions 140A (diameter H1) corresponding to the electrode pads 107 and opening portions 140B (diameter H2) corresponding to the electrode pads 110. Here, the flux layers 131 on the electrode pads 107 and the flux layers 132 on the electrode pads 110 are allowed to be exposed. Here, the opening portions 140A, 140B are so formed as to hold a relationship of diameter H2>diameter H1.

Figure 2E:
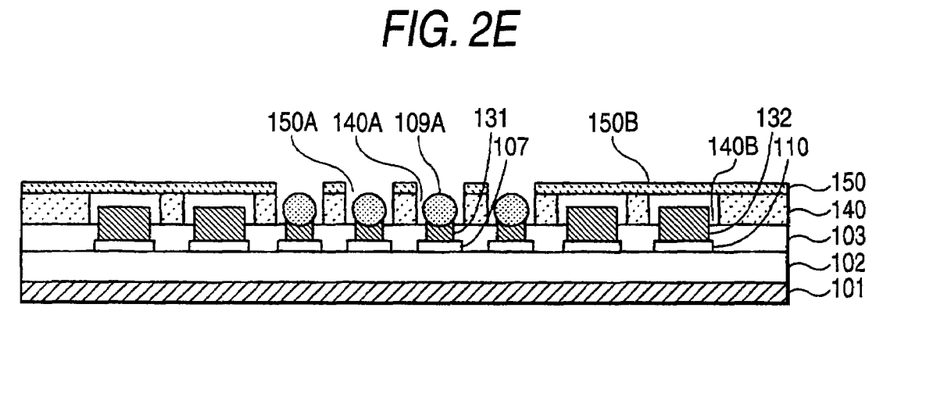
FIG. 2E is a view (No. 5) illustrating the method of producing the wiring substrate according to the first embodiment.

Next, at a step shown in FIG. 2E, a mask 150 is arranged on the base mask 140. The mask 150 is of a structure having opening portions 150A corresponding to the electrode pads 107 (corresponding to the opening portions 140A) and having a protection portion 150B covering the electrode pads 110 (opening portions 140B).

A plurality of solder balls 109A are supplied onto the mask 150 so as to be inserted in the opening portions 140A in the base mask 140 (in the opening portions 150A), and are placed on the flux layers 131 on the electrode pads 107.

Figure 2F:
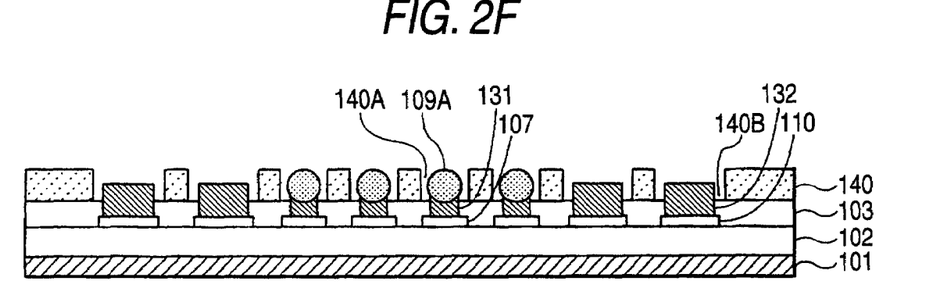
FIG. 2F is a view (No. 6) illustrating the method of producing the wiring substrate according to the first embodiment.

Next, the mask 150 is removed at a step shown in FIG. 2F.

Figure 2G:
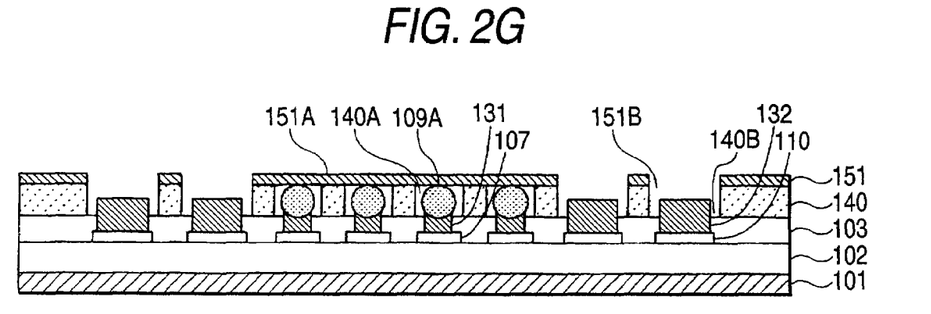
FIG. 2G is a view (No. 7) illustrating the method of producing the wiring substrate according to the first embodiment.

Next, at a step shown in FIG. 2G, a mask 151 is arranged on the base mask 140. The mask 151 is of a structure having opening portions 151B corresponding to the electrode pads 110 (corresponding to the opening portions 140B) and having a protection portion 151A covering the electrode pads 107 (opening portions 140A).

Figure 2H:
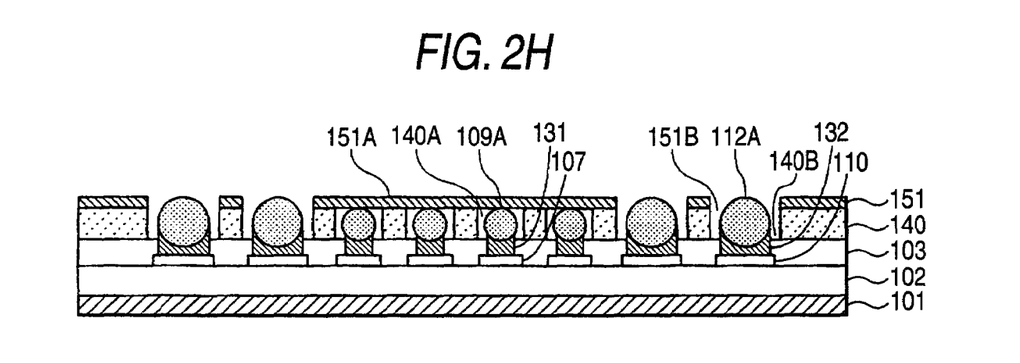
FIG. 2H is a view (No. 8) illustrating the method of producing the wiring substrate according to the first embodiment.

Next, at a step shown in FIG. 2H, a plurality of solder balls 112A are supplied onto the mask 151 so as to be inserted in the opening portions 140B in the base mask 140 (in the opening portions 151B), and are placed on the flux layers 132 on the electrode pads 110. Here, the solder balls 112A have a diameter larger than the diameter of the solder balls 109A.

Figure 2I:
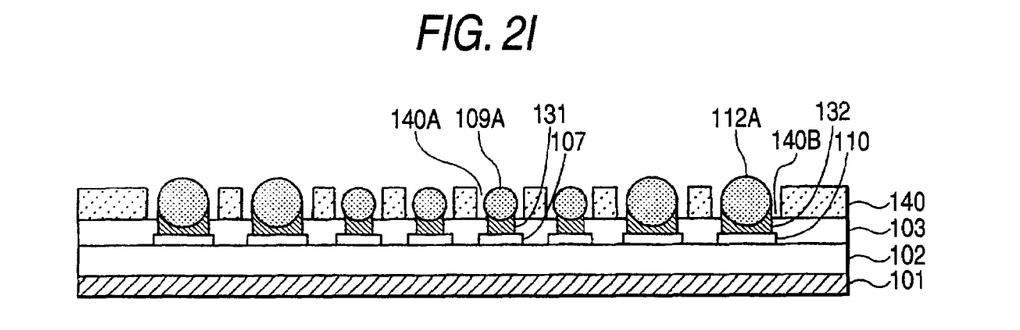
FIG. 2I is a view (No. 9) illustrating the method of producing the wiring substrate according to the first embodiment.

Next, the mask 151 is removed at a step shown in FIG. 2I.

Figure 2J:
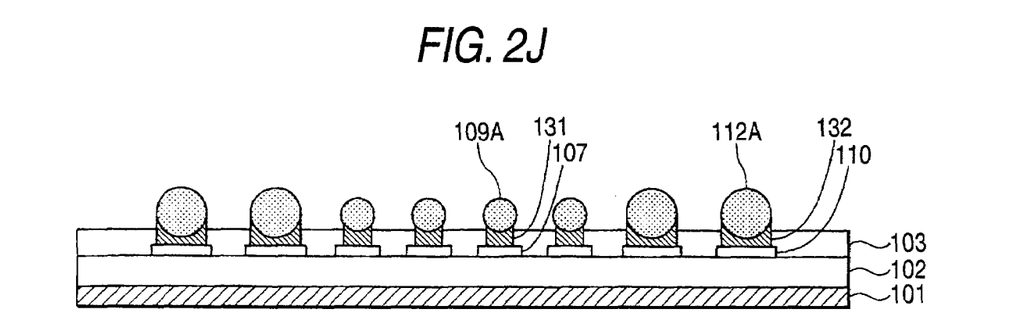
FIG. 2J is a view (No. 10) illustrating the method of producing the wiring substrate according to the first embodiment.

Next, the base mask 140 is removed at a step shown in FIG. 2J.

Figure 2K:
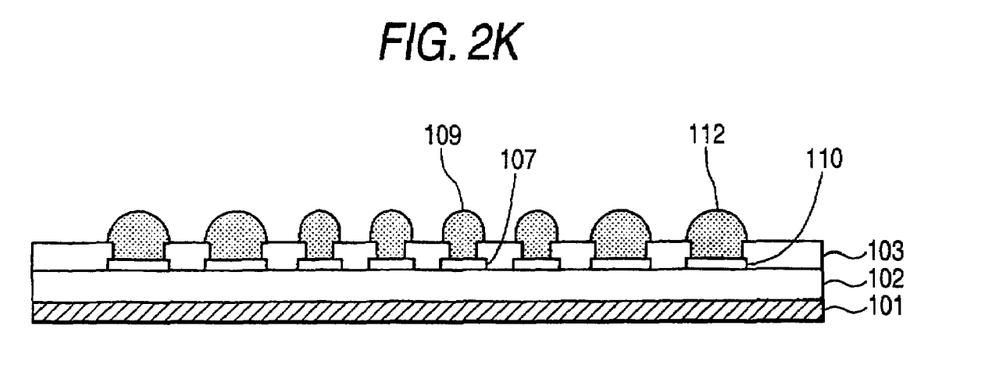
FIG. 2K is a view (No. 11) illustrating the method of producing the wiring substrate according to the first embodiment.

Next, at a step shown in FIG. 2K, the solder balls 109A and 112A are melted to form the solder connection portions (solder bumps) 109, 112. Further, if the solder connection portions 109 and 112 are viewed on a plane, the bumps 109 have a diameter smaller than the diameter of the solder connection portions 112. The bumps 109 and the bumps 112 have substantially the same height to improve precision of mounting.

According to the method of forming the solder connection portions and the method of producing the wiring substrate by using the above method, the solder connection portions of different diameters can be formed on the electrode pads favorably and reliably.

So far, when, for example, it was attempted to simultaneously mount the solder balls of different sizes on a mask, the solder balls having different diameters were often present in a mixed manner. Besides, when the solder balls to be placed have a small difference in the diameters (sizes) thereof, it often occurred that the solder balls were placed on different opening portions (electrode pads)

This embodiment, on the other hand, makes it possible to efficiently utilize the solder balls and to favorably and reliably form solder connection portions of different diameters on the electrode pads.

In this embodiment, further, the solder balls placed on the electrode pads are held by the base mask 140 arranged at the step of FIG. 2D. Therefore, the solder balls are not deviated even when the mask is exchanged at a subsequent step, suppressing the occurrence of interference between the mask and the solder balls caused by the deviated solder balls.

For example, even when the mask 150 is removed in FIG. 2F, the solder balls 109A placed through the step shown in FIG. 2E are held by the base mask 140 and their mounting positions are not greatly deviated. Therefore, even when the mask 151 is arranged at FIG. 2G, the mask 151 does not interfere with the solder balls 109A, and the mask can be arranged maintaining good precision.

Further, the solder balls 109A once placed on the electrode pads 107 (on the flux layers 131) are protected by the protection portion 151A suppressing the occurrence of such problems that the solder balls jump out or the solder balls having different diameters are exchanged for their positions.

Further, the solder balls 109A, 112A of different diameters are placed on the electrode pads substantially separately, and the placed solder balls are isolated by the protection portion preventing the solder balls of different diameters from being mixed together. This makes it easy to regenerate (reuse) the solder balls and to favorably and efficiently form the solder connection portions.

Second Embodiment

Figure 3:
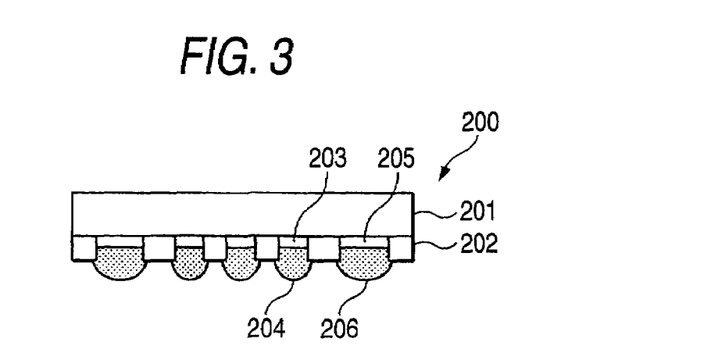
FIG. 3 is a view illustrating a semiconductor device according to a second embodiment.

FIG. 3 is a sectional view schematically illustrating a semiconductor device 200 formed by the method of producing a semiconductor device according to a second embodiment of the invention.

Referring to FIG. 3, the semiconductor device 200 includes a semiconductor chip 201 having electrode pads 203, 205 formed by a known method. A solder resist layer 202 is formed surrounding the electrode pads 203 and 205. Solder connection portions (solder bumps) 204, 206 are formed on the electrode pads 203 and 205, the solder connection potions (solder bumps) 204, 206 being formed by the method of forming solder connection portions of the first or second embodiment.

The solder connection portions 204, 206 are formed by the method illustrated in the first embodiment (FIGS. 2A to 2K).

In this case, the electrode pads 203 correspond to the electrode pads 107, and the electrode pads 205 correspond to the electrode pads 110. Further, the solder connection portions 204 correspond to the solder connection portions 109, and the solder connection portions 206 correspond to the solder connection portions 112.

As described above, the solder connection portions having different sizes (diameters) can be formed on the electrode pads of the semiconductor chip, and a semiconductor device forming solder connection portions of different size on the electrode pads can be produced.

Third Embodiment

Figure 4:
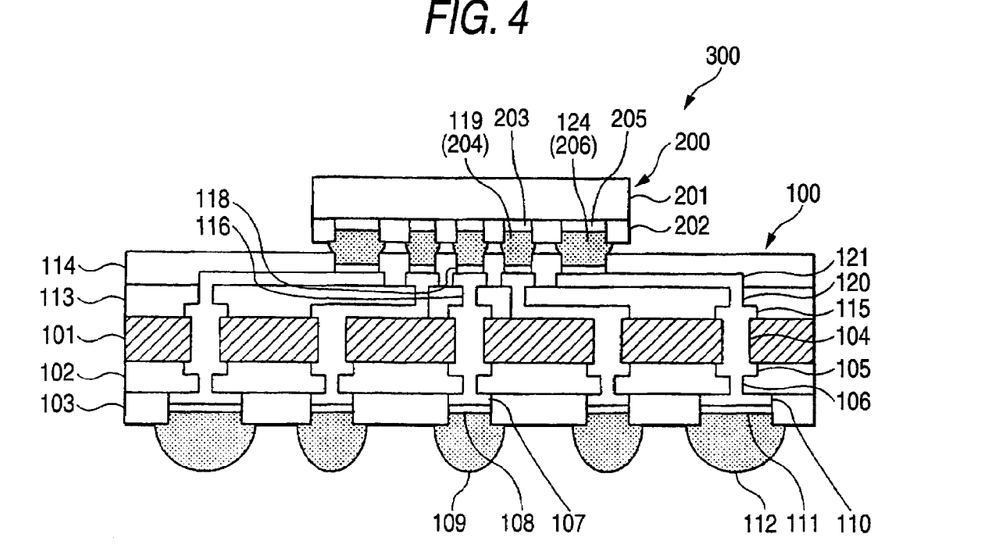
FIG. 4 is a view illustrating the semiconductor device according to a third embodiment.

FIG. 4 is a view of a semiconductor device 300 obtained by flip-chip-mounting the semiconductor device (semiconductor chip) 200 described in the second embodiment on the wiring substrate 100 described in the first embodiment. A semiconductor device can be thus formed by mounting the semiconductor device (semiconductor chip) having a plurality of solder connection portions of different sizes on the wiring substrate having a plurality of solder connection portions of different sizes. Further, when the semiconductor device 200 is mounted in the above structure, the solder connection portions (solder bumps) may be formed on both the wiring substrate 100 side and the semiconductor device 200 side, or may be formed on either side only.

Fourth Embodiment

Figure 5:
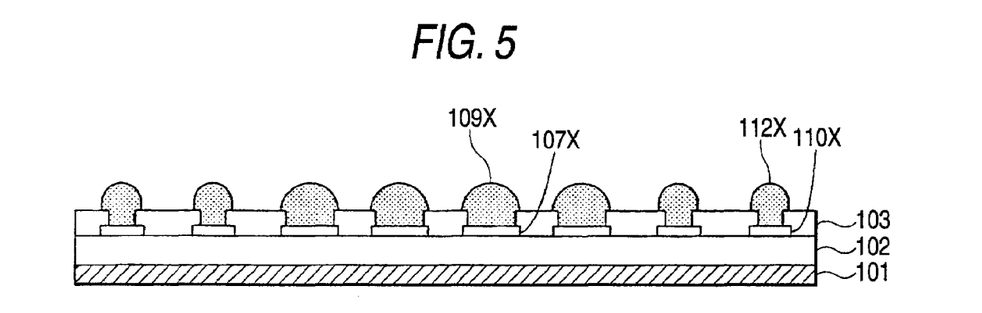
FIG. 5 is a view of an embodiment modified from the first embodiment.

FIG. 5 is a view illustrating an embodiment modified from the first embodiment, and wherein the same portions described above are denoted by the same reference numerals but their description is not repeated. FIG. 5 corresponds to the step shown in FIG. 2K of the first embodiment. In this embodiment, solder connection portions 109X, 112X corresponding to the solder connection portions 109, 112 of FIG. 2K are formed on the electrode pads 107X, 110X that correspond to the electrode pads 107, 110 of FIG. 2K.

In this embodiment, unlike the case of the first embodiment, the electrode pads 110X have a diameter smaller than the diameter of the electrode pads 107X. Corresponding thereto, the solder connection portions 112X have a diameter smaller than the diameter of the solder connection portions 109X.

That is, in this embodiment, the solder connection portions have a large diameter at the central portion of the wiring substrate and have a small diameter at the peripheral portions. Thus, the distribution of sizes of the solder connection portions can be varied and altered.

It is desired that the solder connection portions have an increased size in the central portion when they are used for a semiconductor chip of the power saving type in which power source lines (power source line, ground line) are provided near the central portion of the semiconductor chip or when they are used for a wiring substrate which is for mounting the semiconductor chip of the power saving type. At the peripheral portions of the semiconductor chip (wiring substrate) where signal lines are formed, the solder connection portions have a size smaller than the size of those used for the power source lines.

As described above, the method of forming the solder connection portions, the method of producing wiring substrate and the method of producing the semiconductor device according to the present invention are capable of coping with semiconductor devices of the power saving type.

Though preferred embodiments of the invention were described above, it should be noted that the invention is in no way limited to the above embodiments only but can be varied and modified in a variety of ways without departing from the gist described in the claims.

The invention makes it possible to provide a method of forming solder connection portions for favorably and reliably forming semiconductor connection portions on the electrode pads of different diameters, a method of producing a wiring substrate by using the method of forming the solder connection portions and a method of producing a semiconductor device by using the method of forming the solder connection portions.

What is claimed is:

1. A method of forming solder connection portions on first electrode pads and on second electrode pads, comprising:
    a first step of arranging solder balls on the first electrode pads by arranging a first mask on a base mask, the base mask having first opening portions corresponding to the first electrode pads and second opening portions corresponding to the second electrode pads and having a size different from that of the first opening portions, the first mask having opening portions corresponding to the first opening portions and covering the second opening portions;
    a second step of arranging solder balls on the second electrode pads by arranging a second mask on the base mask, the second mask having opening portions corresponding to the second opening portions and covering the first opening portions; and
    a third step of melting the solder balls.

2. The method of forming solder connection portions according to claim 1, wherein the solder balls arranged on the first electrode pads have a size different from that of the solder balls arranged on the second electrode pads.

3. The method of forming solder connection portions according to claim 1, wherein a diameter of the first opening portions is larger than a diameter of the second opening portions, and a diameter of the first electrode pads is large than a diameter of second electrode pads.

4. A method of producing a wiring substrate by using the method of forming solder connection portions of claim 1.

5. A method of producing a semiconductor device by using the method of forming solder connection portions of claim 1.

* * * * *